(12) United States Patent
Mandelman et al.

(10) Patent No.: US 6,544,874 B2
(45) Date of Patent: Apr. 8, 2003

(54) METHOD FOR FORMING JUNCTION ON INSULATOR (JOI) STRUCTURE

(75) Inventors: Jack A. Mandelman, Stormville, NY (US); Kevin K. Chan, Staten Island, NY (US); Bomy A. Chen, Ridgefield, CT (US); Oleg Gluschenkov, Wappingers Falls, NY (US); Rajarao Jammy, Wappingers Falls, NY (US); Victor Ku, Tarrytown, NY (US); Chung H. Lam, Williston, VT (US); Nivo Rovedo, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/928,759

(22) Filed: Aug. 13, 2001

(65) Prior Publication Data

US 2003/0032272 A1 Feb. 13, 2003

(51) Int. Cl.[7] ........................................ H01L 21/3205
(52) U.S. Cl. .................................................. 438/589
(58) Field of Search .......................... 438/589, 186, 438/191, 217; 257/134, 288

(56) References Cited

U.S. PATENT DOCUMENTS

| 4,571,609 | A |   | 2/1986  | Hatano           |
|-----------|---|---|---------|------------------|
| 4,763,183 | A |   | 8/1988  | Ng et al.        |
| 5,006,479 | A |   | 4/1991  | Brandewie        |
| 5,294,821 | A |   | 3/1994  | Iwamatsu         |
| 5,426,062 | A |   | 6/1995  | Hwang            |
| 5,554,870 | A |   | 9/1996  | Fitch et al.     |
| 5,953,604 | A | * | 9/1999  | Lien ............ 438/217 |
| 6,020,239 | A |   | 2/2000  | Gambino et al.   |
| 6,091,123 | A |   | 7/2000  | Krivokapic et al.|
| 6,147,384 | A |   | 11/2000 | Chen             |

* cited by examiner

Primary Examiner—David Nelms
Assistant Examiner—Thao P Le
(74) Attorney, Agent, or Firm—Scully, Scott, Murphy & Presser; Joseph P. Abate (57) ABSTRACT

A method for forming a JOI structure which allows for reduction in both source/drain junction leakage and capacitance is provided. In the inventive method, an insulator layer is formed under the source/drain regions, but not under the channel region. The insulator layer is formed in the present invention after forming the gate stack region and recessing the semiconductor surface surrounding the gate stack region, followed by deposition of a conductive material such as polysilicon and, optionally, heavy source/drain diffusion formation.

36 Claims, 11 Drawing Sheets

METHOD FOR FORMING JUNCTION ON INSULATOR (JOI) STRUCTURE

RELATED APPLICATIONS

This application is related to co-assigned U.S. application Ser. No. 09/928,738, filed Aug. 13, 2001, the entire content of which is incorporated herein by reference.

FIELD OF THE INVENTION

The present invention relates to semiconductor device fabrication, and more particularly to a method of forming a junction on insulator (JOI) structure which has low junction leakage, reduced junction capacitance, and substantially little or no floating body effects which, if present, may degrade the stability and/or threshold voltage of the semiconductor device. The inventive method does not include the use of a silicon-on-insulator (SOI) substrate; instead a bulk semiconductor substrate is employed.

BACKGROUND OF THE INVENTION

A significant fraction of the total power consumption in low-power bulk complementary metal oxide semiconductor (CMOS) static random access memory (SRAM) and other devices is attributed to the junction leakage in the array which occurs during standby, i.e., when the device is not actively in operation. In typical low-power applications, the active duty factor is less than 1%. This results injunction leakage during standby contributing significantly to the total power. It is therefore necessary to find a means of reducing junction leakage in low-power bulk CMOS SRAMs.

Another problem facing many bulk semiconductor devices is performance degradation which is caused by high source/drain junction capacitance. Reduction in source/drain junction capacitance is thus required in many applications for improved performance.

It is known in the semiconductor industry that a junction on insulator structure allows for both source/drain junction leakage and capacitance to be reduced. Most of the commonly available junction on insulator structures are formed using a silicon-on-insulator (SOI) which includes a buried oxide layer that electrically isolates a top Si-containing layer from a bottom Si-containing substrate layer. A major drawback in forming junction on insulator structures on an SOI is that costly processing steps are required, particularly for the fabrication of the SOI substrate material itself. Moreover, SOI materials are highly susceptible to floating body effects which greatly limit the stability and threshold voltage of the overall device.

Another problem of using SOI materials in forming JOI structures is that it is extremely difficult and, in some instances, nearly impossible to integrate a bulk semiconductor device with a structure containing an SOI material. Such bulk semiconductor devices may include vertical bipolar transistors which may require an SOI material that is considerably thicker than desired for SOI MOSFETs.

In view of the above drawbacks in the prior art, there is still a need for developing a new and improved method of forming a JOI structure on a surface of a bulk semiconductor substrate which has low junction leakage and reduced junction capacitance associated therewith.

SUMMARY OF THE INVENTION

One object of the present invention is to provide a method of forming a JOI structure on a bulk semiconductor substrate.

A further object of the present invention is to provide a method of forming a JOI structure in which standby power reduction caused by junction leakage is substantially reduced.

A yet further object of the present invention is to provide a method of forming a JOI structure having reduced junction capacitance.

A still further object of the present invention is to provide a method of forming a JOI structure which exhibits little or substantially no floating body effects.

An even further object of the present invention is to provide a method of forming a JOI structure using processing steps that are compatible with existing complementary metal oxide semiconductor (CMOS) processing steps, thereby not increasing the fabrication cost of the JOI structure.

These and other objects and advantages are achieved in the present invention by utilizing a method whereby an insulating layer such as an oxide is formed under the source/drain diffusion regions, but not under the channel region. The insulating layer is formed in the present invention after forming the gate stack region and recessing of the semiconductor surface surrounding the gate stack region. These steps of the present invention are followed by deposition of a conductive material and optional heavy source/drain diffusion formation. The optional heavy source/drain diffusion formation is required when the conductive material is polysilicon or amorphous Si, whereas it may be omitted when the conductive material is an elemental metal including alloys, nitrides, and silicides thereof.

Specifically, the method of the present invention comprises the steps of:

(a) selectively recessing portions of a semiconductor substrate that abut one or more gate stack regions, while not recessing other portions of said semiconductor substrate that contain well contacts;

(b) forming an insulating layer on at least said recessed portions of said semiconductor substrate;

(c) filling said recessed portions of said semiconductor substrate with a conductive material and planarizing to a top surface of said one or more gate stack regions;

(d) recessing a portion of said conductive material abutting said one or more gate stack regions, wherein said recessing stops above said insulating layer; and (e) removing said insulating layer from over said well contacts.

When the conductive material employed in step (c) is polysilicon or amorphous Si, then the method of the present invention includes the step of: (f) forming heavy source/drain diffusion regions in said recessed portion of said polysilicon or amorphous Si.

In the present invention, the one or more gate stack regions include at least a gate conductor region, a dielectric capping layer that is formed above the gate conductor region and insulating spacers covering the vertical sidewalls of each gate conductor region. In accordance with the present invention, the dielectric capping layer is removed after step (e) above.

In another embodiment of the present invention, a sacrificial or disposable spacer is formed atop each sidewall spacer that is present on exposed vertical sidewalls of the gate stack region prior to performing step (a) above. The disposable spacers are removed after performing step (a). Note that the spacers covering the vertical sidewalls of the gate region are not removed in either embodiment of the present invention.

DETAILED DESCRIPTION OF THE INVENTION

Figure 1:
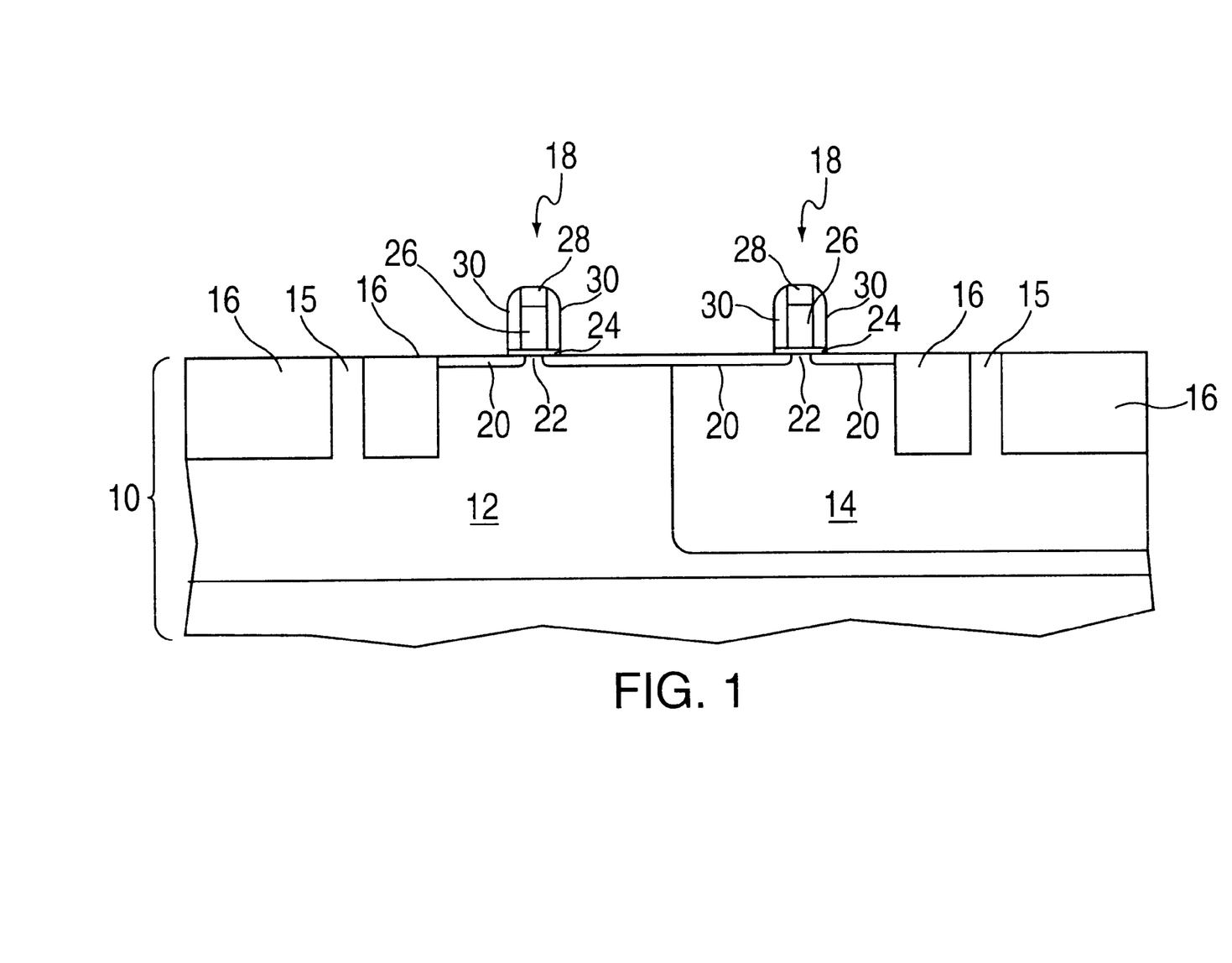
FIGS. 1–9 are pictorial representations (through cross-sectional views) showing a JOI structure through various processing steps of the present invention.

The present invention, which provides a method of fabricating a JOI structure on a bulk semiconductor substrate, will now be described in greater detail by referring to the drawings that accompany the present application. It is noted that like and/or corresponding elements of the drawings are referred to by like reference numerals. Reference is first made to FIGS. 1–9 which illustrate the basic processing steps employed in the present invention in forming a JOI structure on a bulk semiconductor substrate. Specifically, FIG. 1 illustrates an initial semiconductor structure that is formed prior to conducting the first step of the inventive method, i.e., prior to selectively recessing portions of a semiconductor substrate that abut one or more gate stack regions, while not recessing other portions of said semiconductor substrate that contain well contacts regions. Specifically, the structure shown in FIG. 1 comprises semiconductor substrate 10 (n or p-type) which includes P-well region 12 and N-well region 14 formed in portions thereof The structure also includes isolation regions 16 which may be either shallow trench isolation regions or local oxidation of silicon isolation regions formed in portions of the substrate, within each well region. Combinations of these isolation regions are also contemplated herein. Well contact regions 15 are also present between isolation regions 16.

The structure also includes patterned gate stack regions 18 that are formed atop the semiconductor structure. Each patterned gate stack region includes source/drain extension regions 20, channel region 22, gate dielectric 24, gate conductor 26, dielectric capping layer 28 and sidewall spacers 30.

The initial structure shown in FIG. 1 is fabricated using conventional CMOS processing steps that are well known in the art and it is composed of conventional materials that are also well known in the art. For example, semiconductor substrate 10 is comprised of any semiconductor material including, but not limited to: Si, Ge, SiGe, GaAs, InAs, InP and all other III/V compound semiconductors. Semiconductor substrate 10 may also be a layered semiconductor such as Si/Si or Si/SiGe. Of these various semiconductors, it is highly preferred that semiconductor substrate 10 be comprised of Si.

Well regions 12 and 14, respectively are formed by conventional well implantation processes well known in the art. Shallow trench isolation regions are formed utilizing lithography to define the trench opening, etching the trench opening with a conventional dry etching process such as reactive ion etching, lining the trench with a liner material, filling the trench with a dielectric fill material such as tetraethylorthosilicate (TEOS) and planarization. An optional densification step may be carried out prior to planarization. When LOCOS isolations are present, the LOCOS regions are formed by a local oxidation of Si process.

Gate stack regions 18 are then formed using conventional CMOS processing steps that are well known in the art for forming a field effect transistor (FET) on a surface of a semiconductor substrate. For example, the gate stack regions are formed by first forming via a conventional deposition process or a thermal growing process a gate dielectric layer on the surface of semiconductor substrate 10. The thickness of the layer of gate dielectric material 24 formed at this point of the present invention is not critical to the present invention, but typically, gate dielectric 24 has a thickness of from about 1 to about 20 nm after deposition, with a thickness of from about 1.5 to about 10 nm being more highly preferred. It is noted that the gate dielectric material employed in the present invention may be a conventional dielectric material such as $SiO_2$ or $Si_3N_4$, or alternatively, high-k dielectrics such as oxides of Ta, Zr, Hf, Al or combinations thereof may be employed. In one highly preferred embodiment of the present invention, gate dielectric 24 is comprised of an oxide such as $SiO_2$, $ZrO_2$, $Ta_2O_5$, $HfO_2$ or $Al_2O_3$.

After forming gate dielectric 24 on a surface of semiconductor substrate 10, gate conductor 26 is formed atop the layer of gate dielectric. The term "gate conductor" as used herein denotes at least one gate material which comprises a conductive material, a material that can be made conductive via a subsequent process such as ion implantation, or any combination thereof. Illustrative examples of suitable gate materials that can be employed in the present invention include, but are not limited to: polysilicon, amorphous silicon, elemental metals such as W, Pt, Pd, Ru, Rh and Ir, alloys of these elemental metals, suicides or nitrides of these elemental metals, and combinations thereof, e.g., a gate stack including a layer of polysilicon and a layer of conductive metal. A highly preferred gate material employed in the present invention is a gate material that is comprised of polysilicon or amorphous silicon.

Gate conductor 26 is formed on the surface of gate dielectric 24 utilizing a conventional deposition process well known in the art including, but not limited to: CVD, plasma-assisted CVD, evaporation, plating, or chemical solution deposition. When metal silicides are employed, a conventional silicide process may be used in forming the silicide layer. One such silicide process that can be used in the present invention includes the steps of: first forming an elemental metal, annealing the elemental metal so as to form a metal silicide layer therefrom, and removing any unreacted elemental metal utilizing a conventional wet etch process that has a high selectivity for removing unreacted metal as compared to silicide.

It is noted that in embodiments wherein a gate stack comprising multiple gate conductors is employed, e.g., a stack of polysilicon and elemental metal, an optional diffusion barrier (not shown in the drawings) may be formed between each layer of the gate stack. The optional diffusion barrier, which is formed utilizing conventional deposition processes such as those mentioned hereinabove, is-comprised of a material such as SiN, TaN, TaSiN, WN, TiN and other like materials which can prevent diffusion of a conductive material therethrough.

As stated above, dielectric capping layer 28 is present atop the gate material. The dielectric capping layer is comprised of an oxide, nitride or oxynitride and it is formed utilizing a conventional deposition process such as, for example, CVD or plasma-assisted CVD. Alternatively, a conventional thermal growing process such as, for example, oxidation, may be used in forming dielectric capping layer 28.

The structure including dielectric capping layer, gate conductor and gate dielectric is then patterned utilizing conventional lithography and etching. Insulating spacer 30 (i.e., sidewall spacers) composed of an oxide, nitride, oxynitride or any combination or multilayers thereof is then formed on each exposed vertical sidewall of the etched gate region. Note that insulating spacers 30 are permanent spacers and are sometimes referred to herein as sidewall spacers since they are formed on exposed vertical sidewalls of the patterned gate stacks. Source/drain extensions 20 are formed in the semiconductor substrate at this point of the present invention utilizing conventional ion implantation and annealing processes well known in the art. Alternatively, source/drain extension regions 20 may be formed prior to forming insulating spacers 30. A gate sidewall oxidation step may precede implantation of the source/drain extension regions. Additionally, halo implants may be performed at the same time in the inventive process as the source/drain extension implants.

Next, a selective recessing process is performed by first protecting the well contact regions with mask 32 and thereafter utilizing a selective etching process that is highly selective in removing semiconductor material as compared to insulator or mask material. The resultant structure formed after these steps is shown, for example, in FIG. 2. Note that portions (labeled as 31) of the semiconductor substrate abutting each of the gate stack regions have been selectively recessed, while other portions of substrate containing well contacts 15 are not recessed due to the presence of mask 32 which protects the well contact regions.

Figure 2:
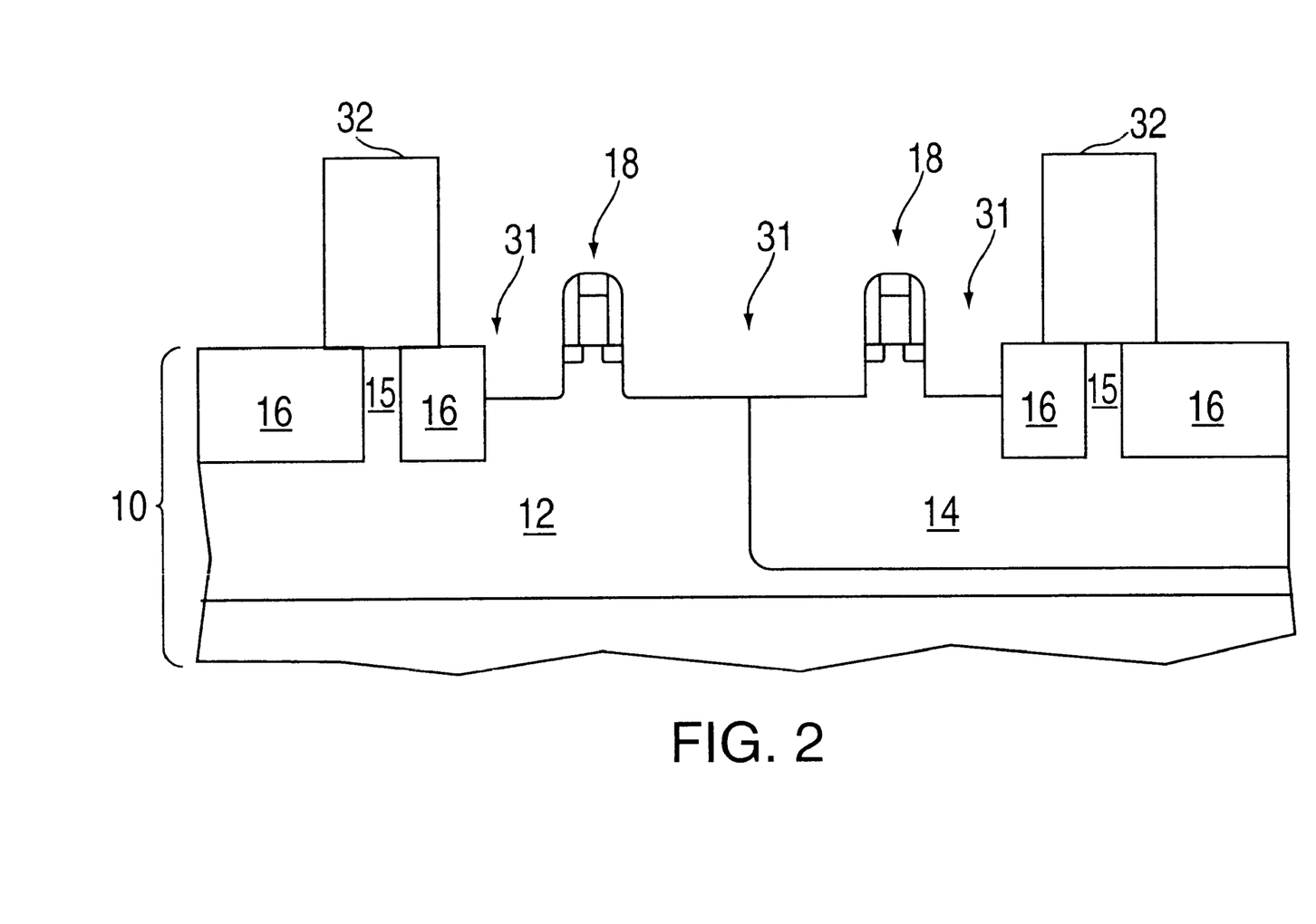

The mask is formed by conventional lithography and a reactive ion etching process can be used in selective recessing the exposed portions of the semiconductor substrate. When the substrate is composed of Si, a reactive-ion etching chemistry containing a plasma of HBr and $Cl_2$ may be employed in the present invention. After the selective recessing process, the mask is removed from atop the well contacts using a conventional stripping technique that is well known to those skilled in the art.

Figure 3:
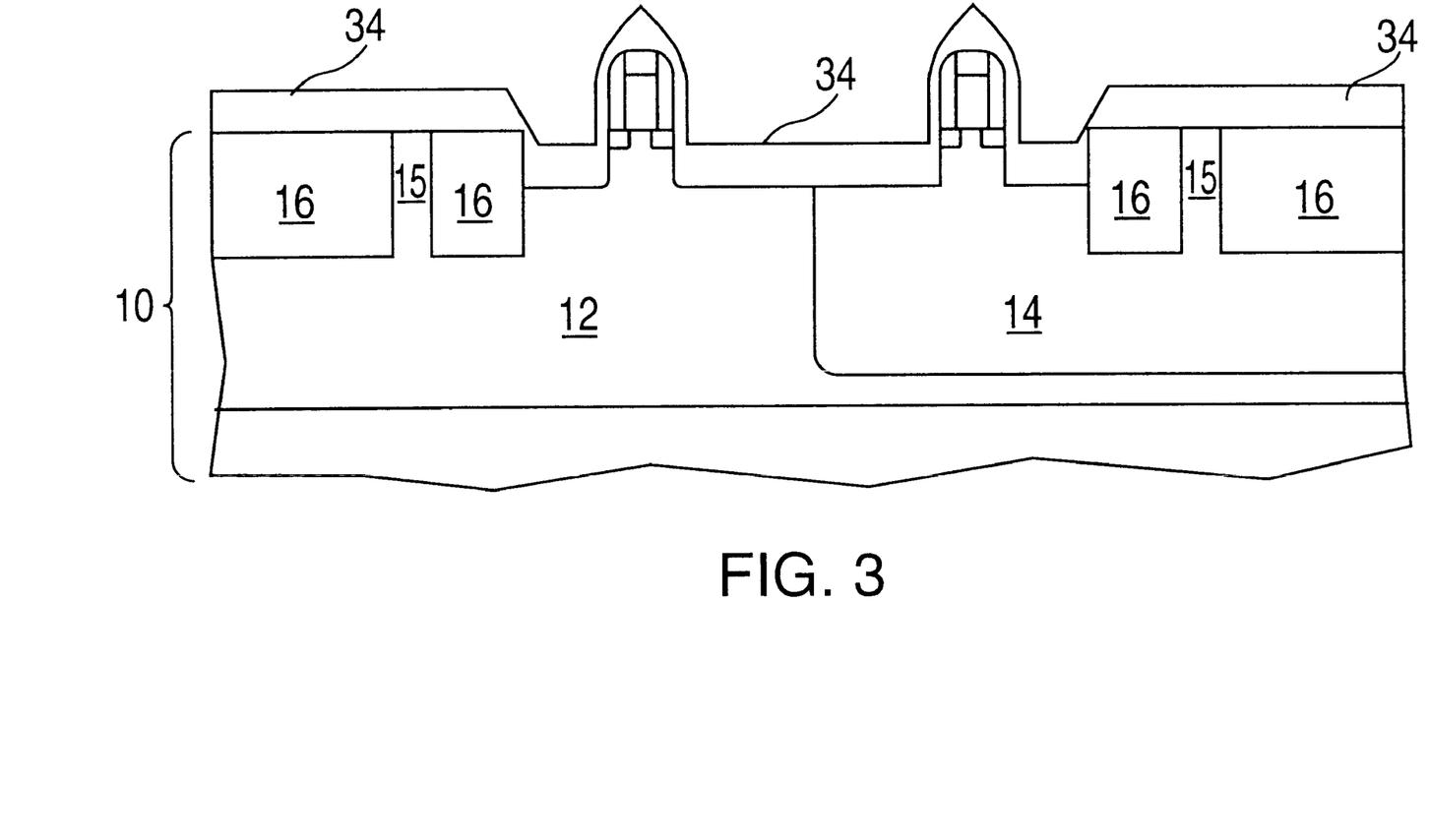

FIG. 3 shows the structure after insulating layer 34 has been formed on all exposed surfaces (including horizontal and vertical) of the structures. That is, in the structure shown in FIG. 3 insulating layer 34 is formed atop the recessed semiconductor substrate, the isolation regions, the well contact regions, and the vertical and horizontal surfaces of the patterned gate stack regions. The insulating layer may be composed of any oxide, nitride or oxynitride material so long as the insulating layer provides the necessary etch selectivity required by subsequent etching processes. Mixtures and multilayers of the aforementioned insulators are also contemplated in the present invention. A highly preferred insulating material is an oxide, with a high-density plasma oxide (HDPO) being more highly preferred. It should be noted that a portion of insulating layer 34 will serve as the backside insulating layer of the inventive JOI structure. HDPO is most preferred in the present invention since it forms predominately on horizontal surfaces, facilitating subsequent contacting of vertical surfaces of source/drain extensions.

Insulating layer 34 may be formed utilizing a conventional deposition process such as CVD, plasma-assisted CVD, evaporation or chemical solution deposition, or alternatively the insulating layer may be formed by a conventional thermal growing process. In a preferred embodiment of the present invention, a conventional deposition process such as high density plasma CVD that is capable of forming an oxide layer that is non-conformal to the sidewall surfaces of each patterned gate stack region is employed. The thickness of the insulating layer formed at this point of the present invention may vary, but typically, insulating layer 34 has a thickness of from about 20 to about 200 nm, with a thickness of from about 50 to about 100 nm being more highly preferred. It is also preferred that insulating material layer 34 forms at least twice as thick on horizontal surfaces than on vertical surfaces.

Figure 4:
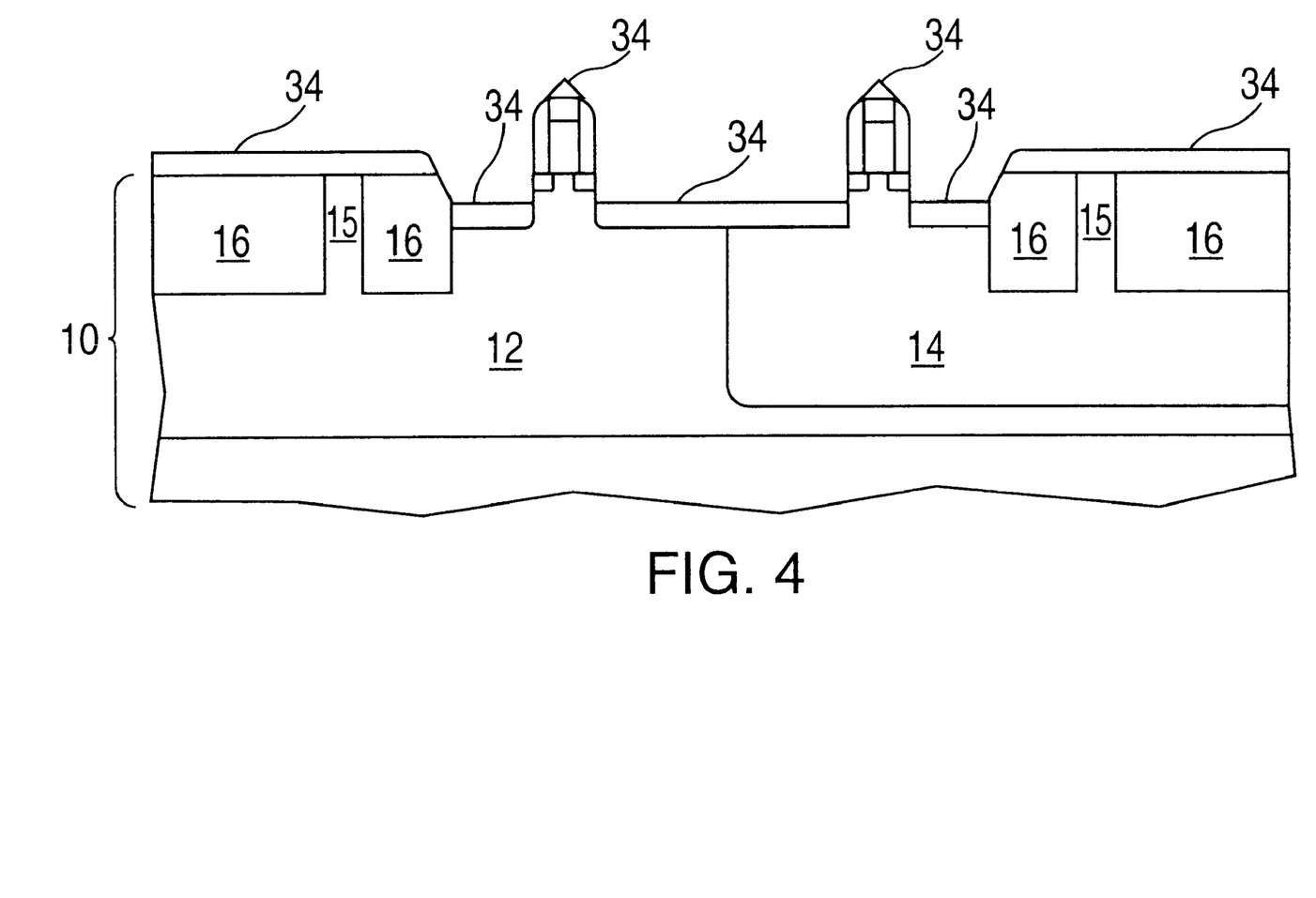

Next, and as shown in FIG. 4, insulating layer 34 is removed from the vertical walls of the each gate stack region utilizing a selective isotropic etching process that is capable of removing the insulating layer from vertical surfaces, leaving the desired thickness of layer 34 on horizontal surfaces. Specifically, the selective etching process comprises a wet etching process wherein a chemical etchant such as dilute HF is employed.

Figure 5:
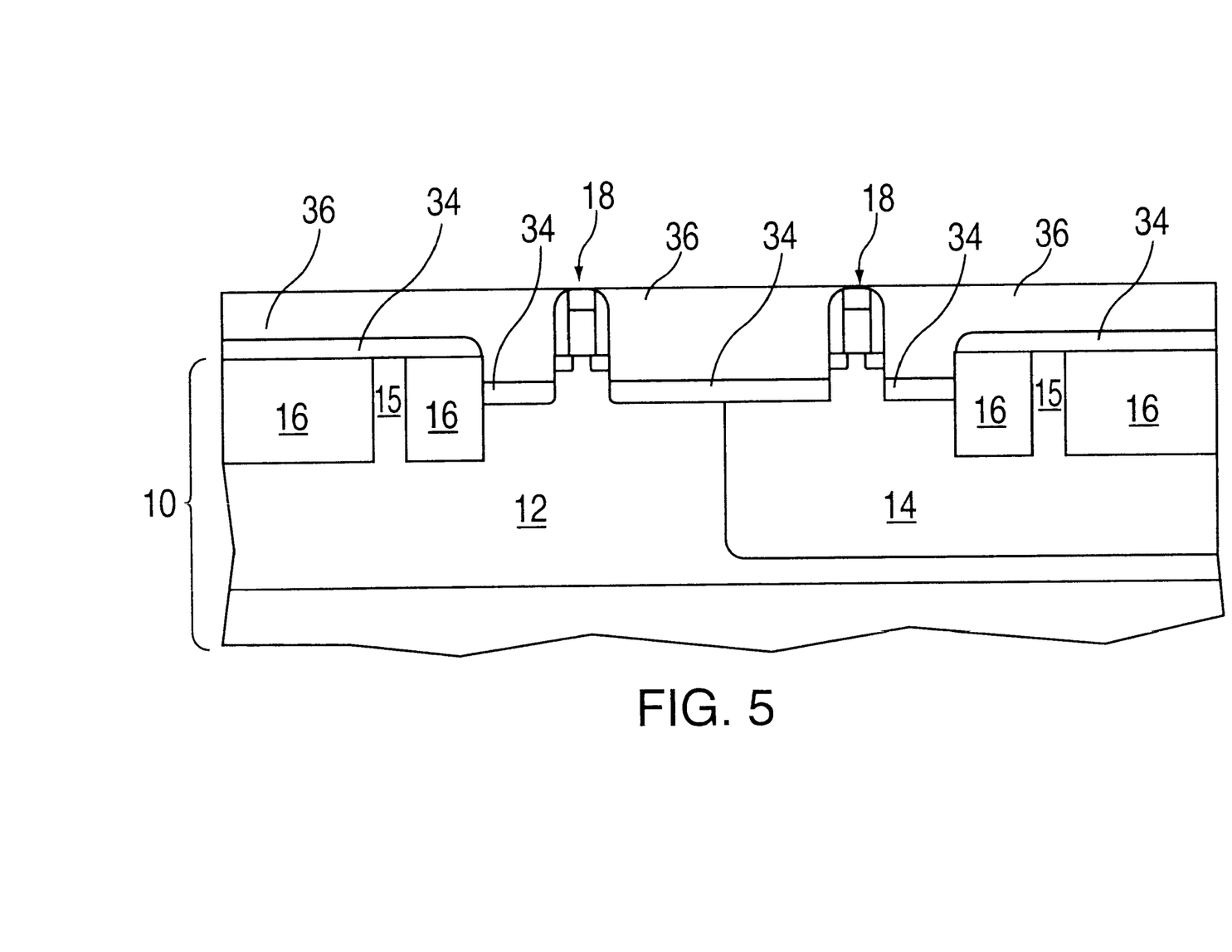
Figure 6:
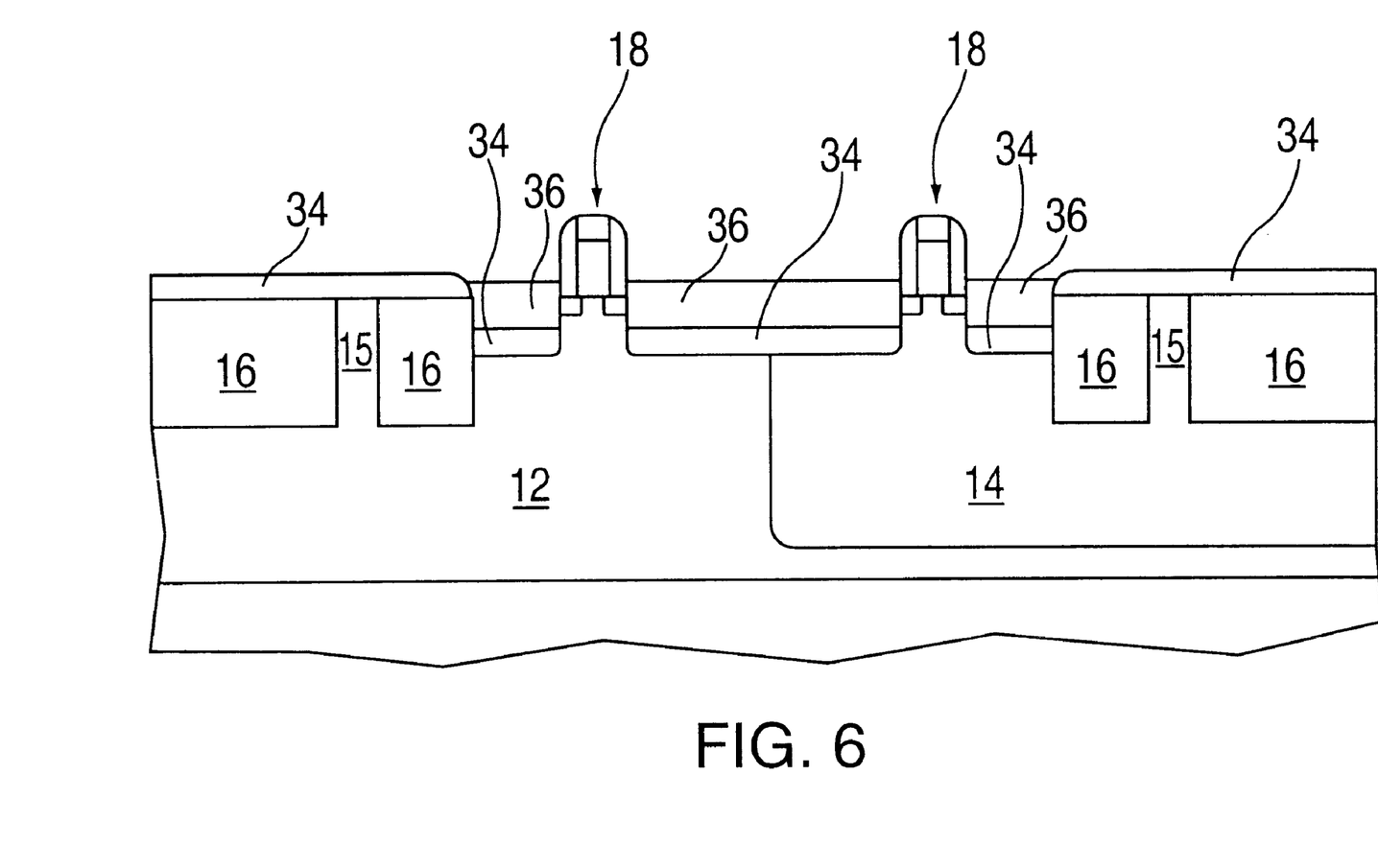

FIG. 5 shows the structure that is obtained after forming a layer of conductive material 36 on the structure. Specifically, the structure shown in FIG. 5 is obtained by overfilling said recessed portions of said semiconductor substrate with a conductive material utilizing a conventional deposition process and thereafter planarizing the conductive material to a top surface of the one or more gate stack regions. The planarizing step includes the use of a conventional planarization process such as chemical-mechanical polishing or grinding.

Suitable conductive materials that are employed at this point of the present invention include the same or different conductive materials as the gate conductor mentioned above. Thus, for example, conductive material 36 may be polysilicon, amorphous Si, an elemental metal, alloys of an elemental metal, silicides of elemental metals, nitrides of elemental metals and any combination thereof including multilayers thereof. In some embodiments, polysilicon and amorphous Si are preferred over the other conductive materials. Note that when other conductive materials are employed besides polysilicon or amorphous Si, it is unnecessary to form heavy source/drain diffusion regions therein.

Following formation of planarizing conductive material layer 36, the structure shown in FIG. 5 is subjected to a selective recessing process wherein a portion of conductive material layer 36 abutting the sidewalls of the gate stack region is removed. Note that the selective recessing process stops above insulating layer 34 that abuts the source/drain extension regions. Any conventional etching process which is highly selective in removing conductive material can be employed in the present invention. For example, a reactive ion etching process which utilizes a plasma comprising HBr and $Cl_2$ can be used to provide the structure shown in FIG. 6. If conductive material 36 is other than polysilicon or amorphous Si, it is required that the top surface of insulating layer 34 be within the source/drain extension regions 20 to avoid shorting the source/drain diffusions to the wells. It may be required to deepen the source/drain extensions 20 to achieve this result.

Figure 7:
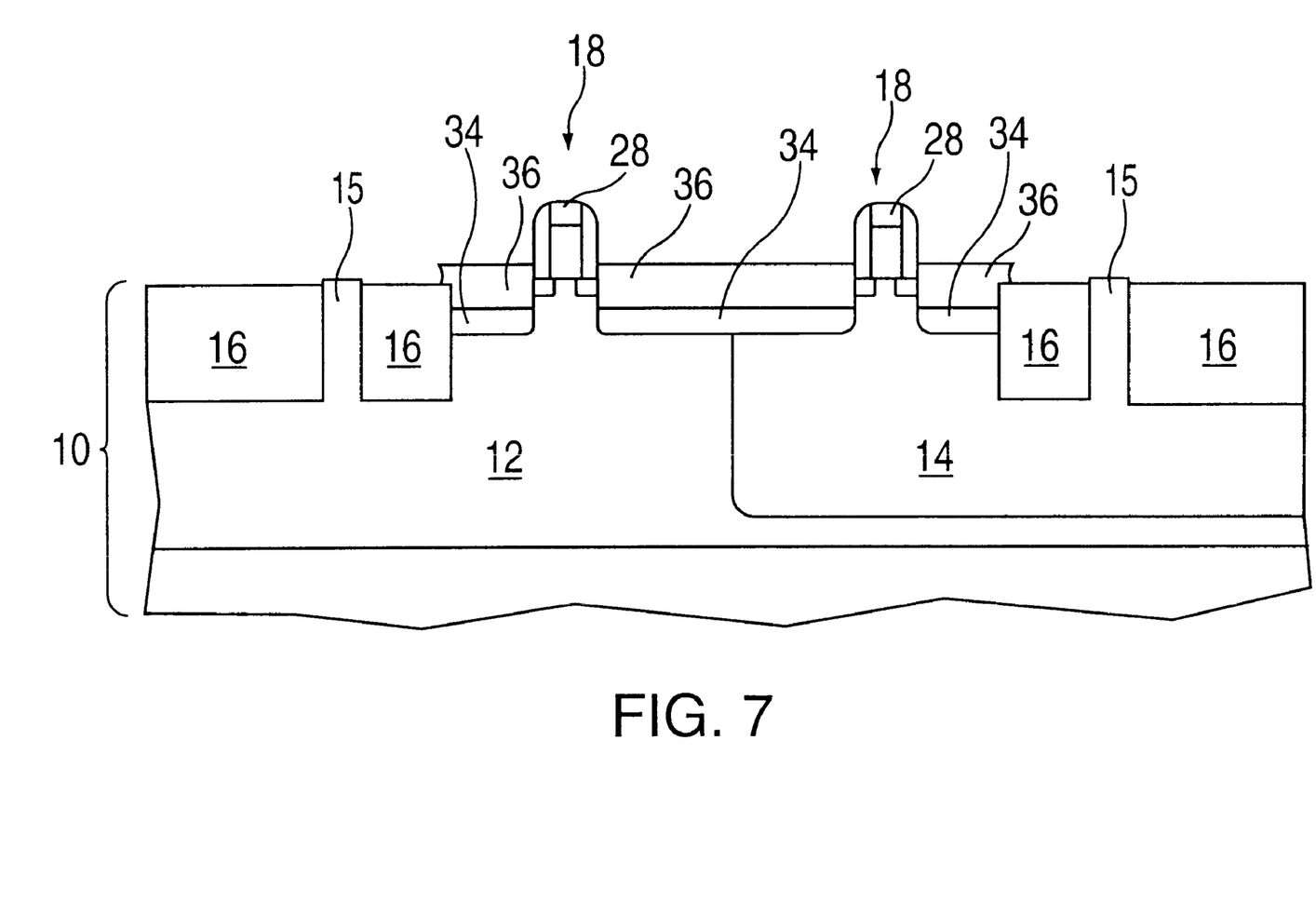

FIG. 7 shows the structure that is obtained after insulating layer 34 has been removed from over the well contact regions as well as the isolation regions. As is shown in this figure, the exposed well contacts extend above the surface of the structure. The insulating layer (i.e., layer 34) is removed at this point of the present invention using any chemical wet etching process which exhibits a high selectivity for removing insulating material. For example, a dilute HF solution can be used at this point of the present invention.

Figure 8:
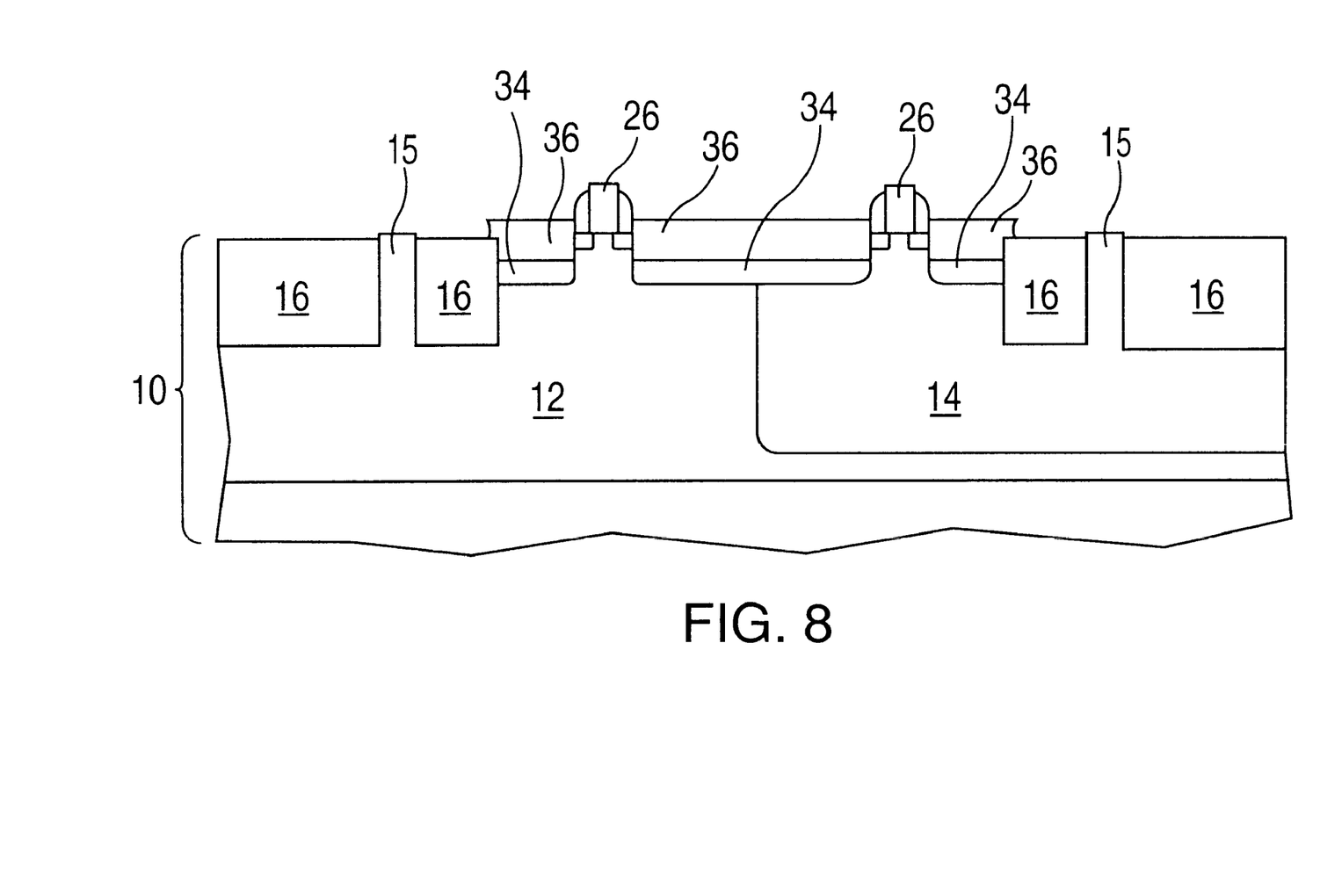

FIG. 8 shows the structure after dielectric capping layer 28 is removed from atop each of the patterned gate stack regions. Specifically, the dielectric capping layer is removed utilizing an etching process which is highly selective in removing the dielectric capping layer. For example, when the dielectric capping layer is comprised of a nitride or an oxynitride, a reactive ion etching process which includes a plasma mixture of $CH_3F$, Ar and $O_2$ can be employed.

Figure 9:
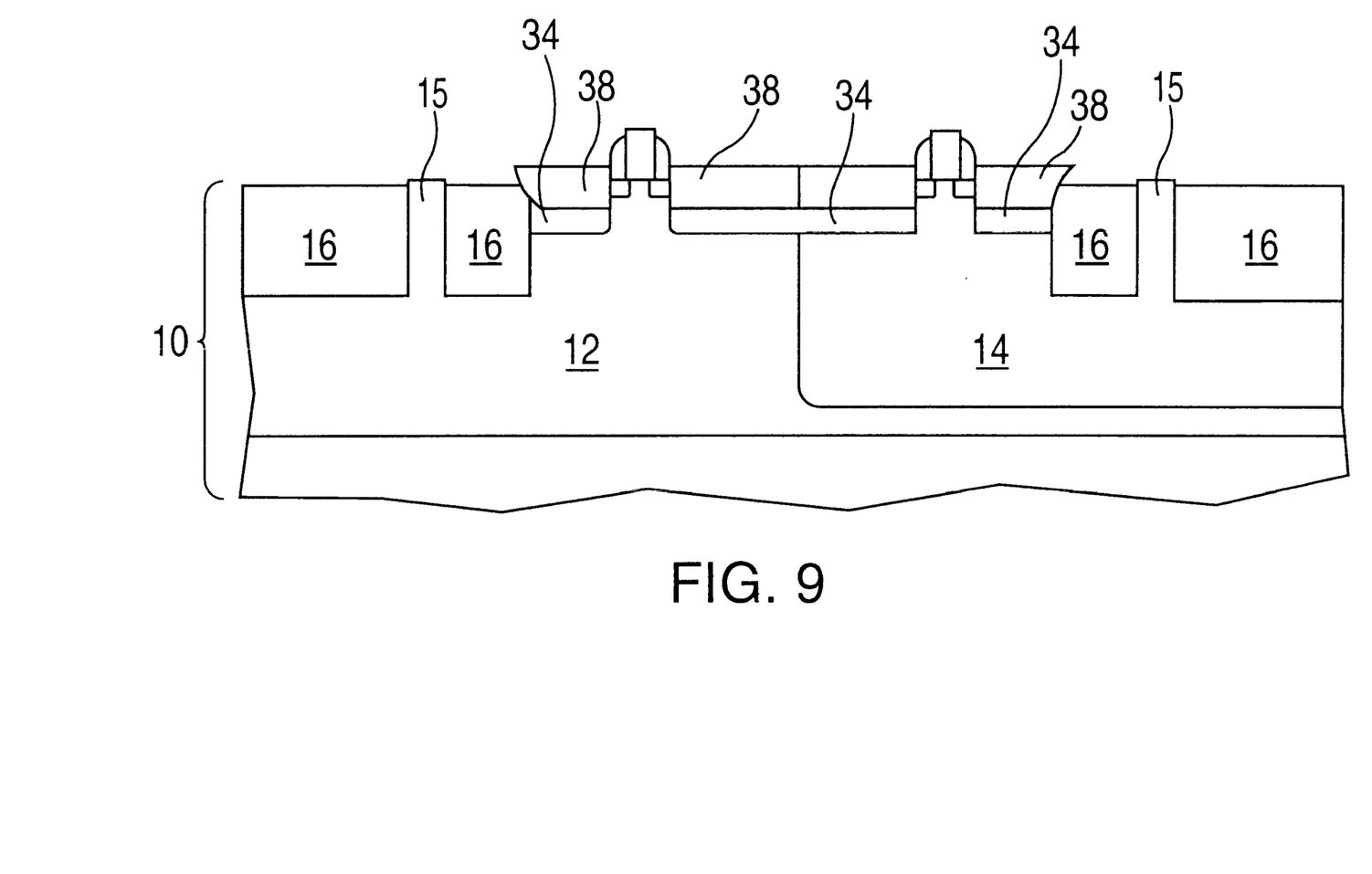

FIG. 9 illustrates the JOI structure of the present invention after heavy source/drain diffusion regions 38 are formed in recessed conductive material layer 36 that abuts sidewalls of the source/drain extension regions. Specifically, the heavy source/drain diffusion regions may, in one embodiment, be formed utilizing a conventional ion implantation process wherein ion doses of about 1E15 atoms/$cm^{-2}$ or above are employed. The implant regions may be activated at this point of the present invention utilizing a conventional activation annealing process wherein annealing temperatures of about 900° C. or higher are employed. Alternatively, a conventional gas phase doping, solid source doping or plasma immersion doping may be employed in forming heavy source/drain diffusion regions 38. Note that the formation of the heavy source/drain diffusion regions may be omitted in circumstances wherein conductive material layer 36 is a conductive material other than polysilicon or amorphous Si.

Following the above processing steps, the structure may be subjected to a conventional silicidation process wherein a silicide region is formed atop any exposed Si surface. The silicide process includes deposition of an elemental metal such as Ti, Ni, or Co on exposed Si surfaces, annealing the elemental metal and Si layers so as to convert the same to a metal silicide region, and removing any non-reacted elemental metal from the structure. Additionally, the present invention also contemplates forming diffusion contacts as well as wiring regions to the JOI structure of the present invention.

Figure 10:
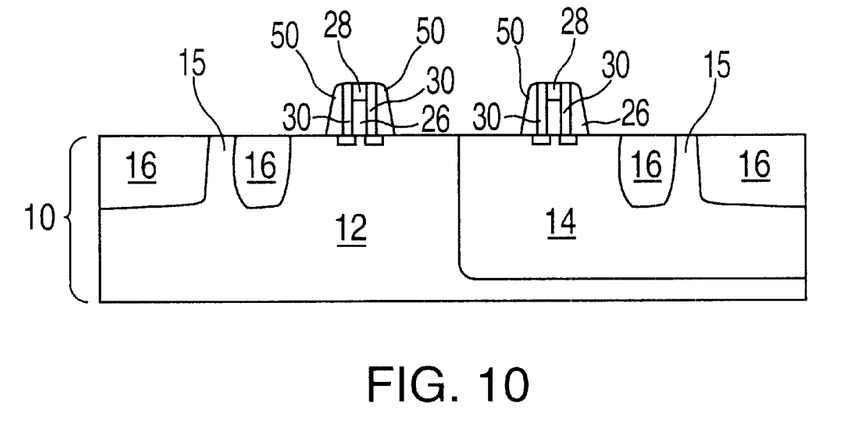
FIGS. 10–13 show an alternative embodiment of the present invention wherein a disposable spacer is employed.

FIGS. 10–13 show an alternative method of the present invention wherein disposable spacers are employed. Specifically, FIG. 10 shows the initial structure used in the alternative embodiment of the present invention which is the same as that shown in FIG. 1 except for the presence of disposable spacers 50. Note that that the disposable spacers are formed atop insulating spacers 30 surrounding the vertical sidewalls of the gate stack. The disposable spacers are composed of an insulating material that differs from that of insulating spacers 30.

Figure 11:
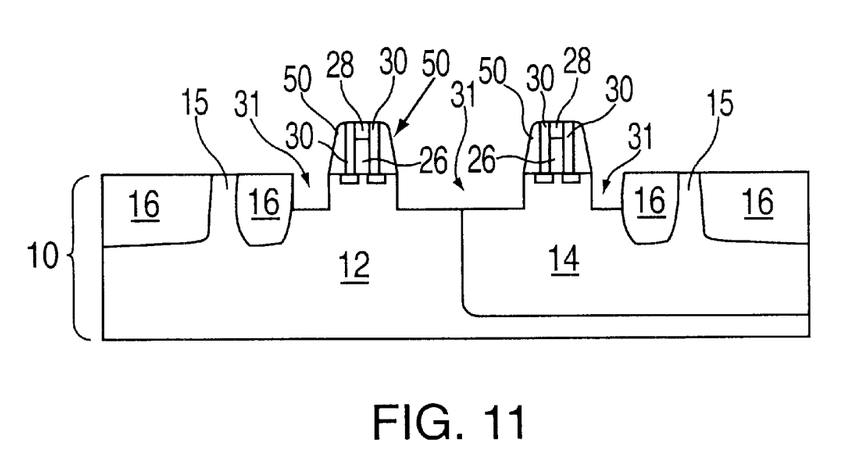
Figure 12:
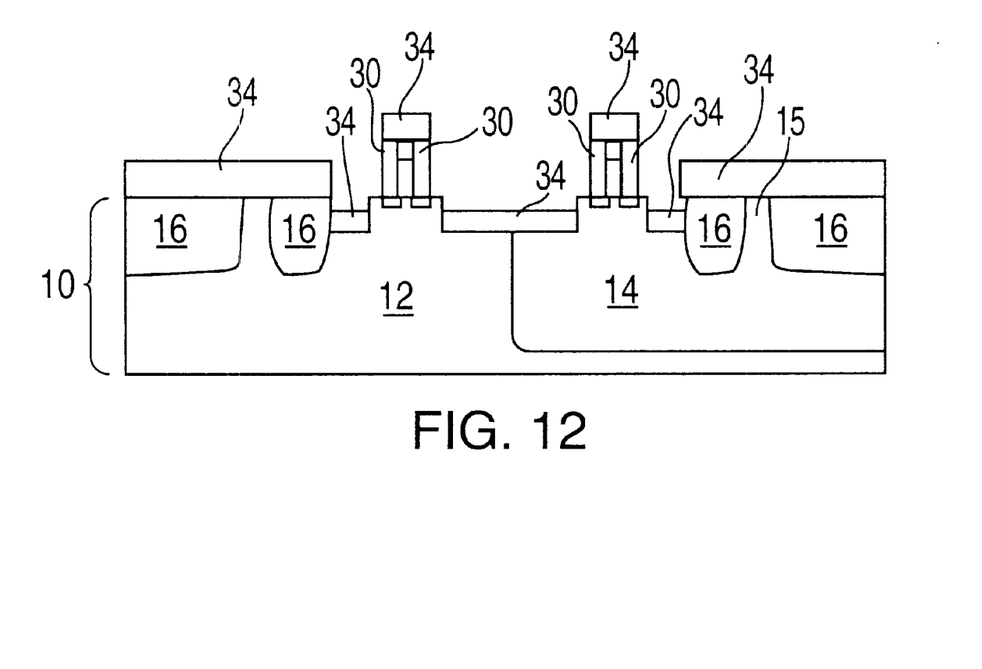
Figure 13:
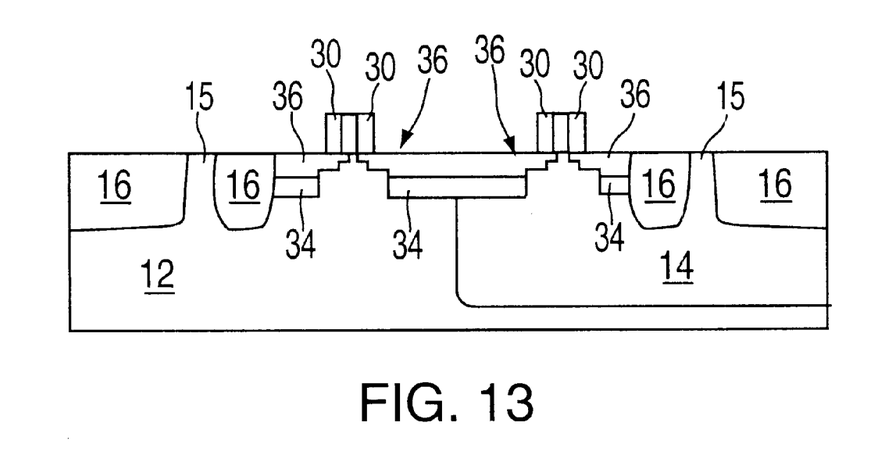

With the disposable spacers in place, the structure shown in FIG. 10 is subjected to the selective recessing process mentioned above in connection with FIG. 2 so as to provide the structure shown in FIG. 11. The disposable spacers are then removed utilizing a conventional stripping process well known in the art (See, for example, the structure shown in FIG. 12) and thereafter the various processing steps mentioned above in connection with FIGS. 3–9 are performed. The resultant JOI structure from the alternative embodiment is shown in FIG. 13.

The purpose of the disposable spacer is to provide a mask for forming small, controlled dimension regions of Si (or other conductive material), each of which is in contact with the substrate and self-aligned to an adjacent gate edge. The regions of Si adjacent to the gate edges provide increased area for forming source/drain diffusion regions in a single crystalline substrate, reducing leakage associated with the proximity of the non-crystalline Si source/drain regions to the junction edge. Furthermore, the structure realized by this alternative embodiment of the present invention provides a landing area over the substrate for formation of a salicide (i.e., self-aligned silicide) layer, eliminating the concern that doping under the salicide layer may be compensated by interdiffusion of adjacent source/drain doping regions.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope and spirit of the appended claims.

Having thus described our invention in detail, what we claim as new and desire to secure by the Letters Patent is:

1. A method of fabricating a junction on insulator (JOI) structure comprising the steps of:
   (a) selectively recessing portions of a semiconductor substrate that abut one or more gate stack regions, while not recessing other portions of said semiconductor substrate that contain well contacts;
   (b) forming an insulating layer on at least said recessed portions of said semiconductor substrate;
   (c) filling said recessed portions of said semiconductor substrate with a conductive material and planarizing to a top surface of said one or more gate stack regions;
   (d) recessing a portion of said conductive material abutting said one or more gate stack regions, wherein said recessing stops above said insulating layer; and
   (e) removing said insulating layer from over said well contacts.

2. The method of claim 1 wherein said semiconductor substrate comprises a semiconductor material selected from the group consisting of Si, Ge, SiGe, GaAs, InAs, InP, Si/Si and Si/SiGe.

3. The method of claim 1 wherein said semiconductor substrate comprises Si.

4. The method of claim 1 wherein said well contact regions are abutted by isolation regions that are also formed in said semiconductor substrate.

5. The method of claim 4 wherein said isolation regions are shallow trench isolation regions or local oxidation of silicon regions.

6. The method of claim 1 wherein said one or more patterned gate stack regions comprise at least a gate dielectric formed atop a surface of said semiconductor substrate; a gate conductor formed atop said gate dielectric; and insulating spacers formed on exposed vertical sidewalls of said gate dielectric and gate conductor.

7. The method of claim 6 further comprising a dielectric capping layer formed atop said gate conductor.

8. The method of claim 6 wherein said dielectric capping layer is removed after performing step (e).

9. The method of claim 8 wherein said dielectric capping layer is removed by a reactive ion etching process.

10. The method of claim 1 wherein step (a) comprising the steps of forming a mask over the well contacts and etching exposed surfaces of said semiconductor substrate.

11. The method of claim 10 wherein said etching comprises reactive ion etching.

12. The method of claim 11 wherein said reactive ion etching includes the use of a plasma containing HBr and $Cl_2$.

13. The method of claim 1 wherein said insulating layer is composed of an oxide, nitride, oxynitride or any combination and mutilayers thereof.

14. The method of claim 13 wherein said insulating layer is composed of an oxide.

15. The method of claim 14 wherein said oxide is a high-density plasma deposited oxide.

16. The method of claim 1 wherein said insulating layer is formed by a deposition process or a thermal growing process.

17. The method of claim 1 wherein step (a) includes forming said insulating layer on vertical surfaces that surround said gate stack regions.

18. The method of claim 17 wherein said insulating layer is selectively removed from said vertical surfaces prior to performing step (c).

19. The method of claim 18 wherein said insulating layer is removed from said vertical surfaces by a selective isotropic etching process.

20. The method of claim 19 wherein said selective isotropic etching process includes the use of dilute HF as a chemical etchant.

21. The method of claim 1 wherein said insulating layer has a thickness of from about 20 to about 200 nm.

22. The method of claim 21 wherein said insulating layer has a thickness of from about 50 to about 100 nm.

23. The method of claim 1 wherein said filling step comprises a deposition process.

24. The method of claim 1 wherein said conductive material comprises polysilicon, amorphous Si, a conductive elemental metal, alloys of a conductive elemental metal, suicides of a conductive elemental metal, nitrides of a conductive elemental metal or any combination and multilayers thereof.

25. The method of claim 24 wherein said conductive material is polysilicon or amorphous Si.

26. The method of claim 1 wherein said planarizing step includes chemical-mechanical polishing or grinding.

27. The method of claim 1 wherein step (d) comprises a reactive ion etching process.

28. The method of claim 27 wherein said reactive ion etching includes the use of a plasma comprising HBr and $Cl_2$.

29. The method of claim 1 wherein step (e) comprises a chemical wet etching process.

30. The method of claim 29 wherein said chemical wet etching process includes the use of dilute HF.

31. A method of fabricating a junction on insulator (JOI) structure comprising the steps of:

(a) selectively recessing portions of a semiconductor substrate that abut one or more gate stack regions, while not recessing other portions of said semiconductor substrate that contain well contacts;

(b) forming an insulating layer on at least said recessed portions of said semiconductor substrate;

(c) filling said recessed portions of said semiconductor substrate with polysilicon or amorphous Si and planarizing to a top surface of said one or more gate stack regions;

(d) recessing a portion of said polysilicon or amorphous Si abutting said one or more gate stack regions, wherein said recessing stops above said insulating layer;

(e) removing said insulating layer from over said well contacts; and (f) forming source/drain diffusion regions in said recessed portion of said polysilicon or amorphous Si.

32. The method of claim 31 wherein said source/drain diffusion regions are formed by ion implantation, gas phase doping, solid source doping or plasma immersion doping.

33. A method of fabricating a junction on insulator (JOI) structure comprising the steps of:

(a) selectively recessing portions of a semiconductor substrate that abut one or more gate stack regions, while not recessing other portions of said semiconductor substrate that contain well contacts, wherein said one or more gate stack regions include disposable spacers formed atop insulating spacers that are formed on exposed vertical sidewalls of each of said one or more gate stack regions;

(b) removing said disposable spacers;

(c) forming an insulating layer on at least said recessed portions of said semiconductor substrate;

(d) filling said recessed portions of said semiconductor substrate with a conductive material and planarizing to a top surface of said one or more gate stack regions;

(e) recessing a portion of said conductive material abutting said one or more gate stack regions, wherein said recessing stops above said insulating layer; and (f) removing said insulating layer from over said well contacts.

34. The method of claim 33 wherein said conductive material comprises polysilicon or amorphous Si.

35. The method of claim 34 further comprising forming source/drain diffusion regions in said recessed portion of said polysilicon or amorphous Si.

36. A method of fabricating a junction on insulator (JOI) structure comprising the steps of:

(a) selectively recessing portions of a Si substrate that abut one or more gate stack. regions, while not recessing other portions of said Si substrate that contain well contacts;

(b) forming a high-density plasma oxide layer on at least said recessed portions of said Si substrate;

(c) filling said recessed portions of said Si substrate with polysilicon and planarizing to a top surface of said one or more gate stack regions;

(d) recessing a portion of said polysilicon abutting said one or more gate stack regions, wherein said recessing stops above said high-density plasma oxide layer;

(e) removing said high-density plasma oxide layer from over said well contacts; and (f) forming source/drain diffusion regions in said recessed portion of said polysilicon.

* * * * *